United States Patent
Itagaki et al.

[11] Patent Number: 5,728,215
[45] Date of Patent: Mar. 17, 1998

[54] METHOD FOR FORMING A FILM BY SELECTIVE AREA MOCVD GROWTH

[75] Inventors: Takushi Itagaki; Masayoshi Takemi; Norio Hayafuji, all of Tokyo, Japan

[73] Assignee: Mitsubishi Denki Kabushiki Kaisha, Tokyo, Japan

[21] Appl. No.: 555,707

[22] Filed: Nov. 14, 1995

[30] Foreign Application Priority Data

Mar. 27, 1995 [JP] Japan .................................. 7-067311

[51] Int. Cl.$^6$ .................................................. C30B 25/04
[52] U.S. Cl. .................................. 117/104; 127/95; 127/97
[58] Field of Search .......................... 117/95, 97, 104, 117/913

[56] References Cited

U.S. PATENT DOCUMENTS

| | | | |
|---|---|---|---|
| 4,632,723 | 12/1986 | Smith et al. | 117/913 |
| 5,436,192 | 7/1995 | Epler et al. | 437/129 |
| 5,452,383 | 9/1995 | Takiguchi | 385/16 |
| 5,561,079 | 10/1996 | Partin | 437/132 |

OTHER PUBLICATIONS

Von mark A. Reed, "Mit extrem miniaturisierten, nur millionstel Millimeter kleinen Halbleiter–Strukturen vermag die Nanotechnik heute sogar einzelne Elektronen punktgenau zu fixieren.".
Spektrun der Wissenschaft, Mar. 1993, pp. 52–57.
Bailey et al., "Effect of Crystal Orientation on Anisoytropic Etching and MOCVD Growth of Grooves on GaAs", J. Electrochem. Soc., vol. 136, No. 11, Nov. 1989, pp. 3444–3449.

Primary Examiner—Felisa Garrett
Attorney, Agent, or Firm—Leydig, Voit & Mayer, Ltd.

[57] ABSTRACT

A method for forming a film by selective area growth by MDCVD technique includes forming a mask on a semiconductor substrate having a (100) plane, the mask having a mask opening to selectively growing a compound semiconductor layer, and a slit which is narrower than the mask opening in width and controls the growth rate of the compound semiconductor layer at the mask opening; and selectively growing the compound semiconductor layer at a growth rate which is on the mask in the mask opening and the slit.

27 Claims, 8 Drawing Sheets

*1 Outer portion of mask piece
*2 Center portion of mask piece
*3 Inner portion of mask piece

METHOD FOR FORMING A FILM BY SELECTIVE AREA MOCVD GROWTH

BACKGROUND OF THE INVENTION

1. Field of the Invention

The present invention relates to a method for forming a film by selective area growth by MOCVD using a dielectric mask, in particular a method for controlling a growth rate in growing a semiconductor optical waveguide structure.

2. Discussion of Background

The selective area growth using metal organic chemical vapor deposition (MOCVD); a dielectric mask utilizes an effect that a growth rate increases at an edge and a peripheral portion of the mask. This effect occurs because growth species reaching the mask diffuse in the vapor phase or on the mask surface toward the peripheral portion of the mask to a semiconductor substrate.

Figure 8A:
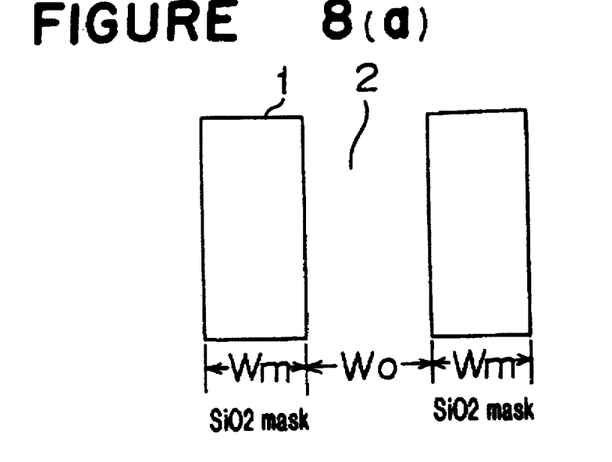
FIG. 8(a) is a top plan view showing a conventional mask.
Figure 8B:
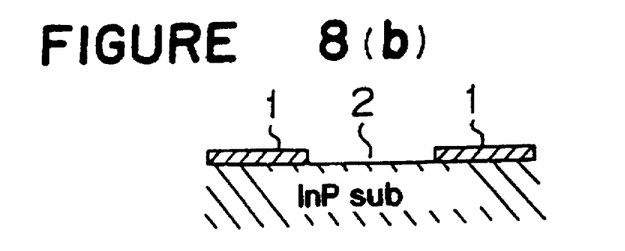
FIG. 8(b) is a cross-sectional view showing the conventional mask.

In FIGS. 8(a) and 8(b), there are shown a top plan view and a cross-sectional view of a conventional mask. In these Figures, reference numeral 1 designates a mask, and reference numeral 2 designates an opening in the mask. In the; fabrication of a conventional practical device, two mask elements having a width Wm are spaced Wo apart as shown in FIG 8a), and the growth rate increasing effect at a region (a region of the space Wo) sandwiched between the mask elements 1, i.e. the opening 2, is utilized. The growth rate at the region increases in proportion to the mask width Wm, and further increases when the mask space Wo gets narrower. Accordingly, the presence of a difference in growth rate between a peripheral portion of the mask 1 and the opening 2 at the region sandwiched by the mask pieces 1, and regions remote from the mask 1 enables the mask 1 to control the distribution of the thickness of a layer grown on an upper surface of the substrate.

In the past, various kinds of optical devices have been produced using such a principle. Because the mask 1 which has been formed once can not be removed or changed in terms of width or space until completion of the growth process, the growth rate during growth is one which has a constant increase rate which is determined by the width and the opening of the formed mask 1.

Figure 8C:
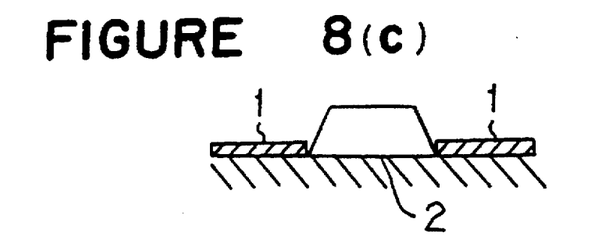
FIG. 8(c) is a cross-sectional view showing a growth layer when using the conventional mask.
Figure 8D:
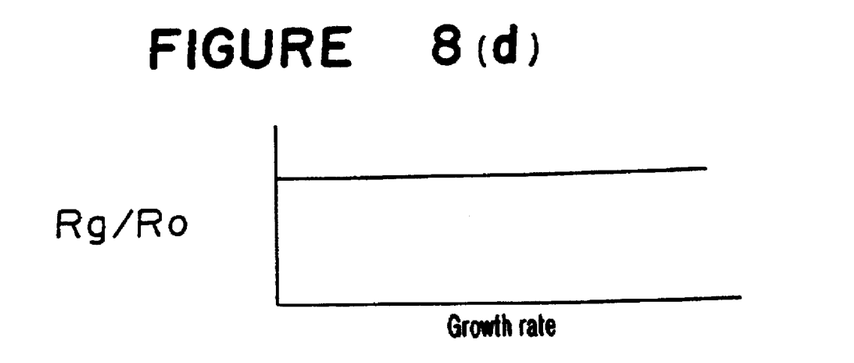
FIG. 8(d) is a graph showing a change in growth rate with regard to growth time at the mask opening of the conventional mask.

For example, when the conventional technique is applied to fabrication of an optical waveguide device, such as a semiconductor laser with an optical waveguide modulator, selective growth is made in the order of a lower cladding layer, a multiple-quantum well structure (MQW) waveguide layer, an upper cladding layer, and a contacting layer at the opening 2 as shown in the sectional view of FIG. 8(c), and all semiconductor layers have a constant increase in growth rate. At a region remote from the mask 1, growth is made at a normal growth rate. As a result, the band gap difference in; the waveguide layer occurs due to a change in layer thickness in an MQW structure between a region remote from the mask 1 and the opening 2, and two functional elements of the semiconductor laser and the optical waveguide modulator are simultaneously fabricated. In FIG. 8(d), there is shown a view of a change in growth rate with respect to growth time at the conventional mask opening 2. In this figure, $R_g$ refers to the growth rate at an arbitrary point in a peripheral portion of the mask, and $R_0$ refers to the growth rate at an arbitrary point quite away from the mask. This figure shows that the increase in growth rate is constant throughout the growth time in using the conventional mask 1.

The conventional selective area growth using MOCVD has a disadvantage in that layer thickness is increased even in a layer having no need for the layer thickness increasing effect because the growth rate increase at the opening 2 is constant during the growth of all semiconductor layers which are grown using the same mask. For example, in order to obtain necessary functions in two elements of the semiconductor laser and the optical waveguide modulator, it is enough for a change in layer thickness to occur only in the MQW structure, and an increase in layer thickness is not necessary in other semiconductor layers. In particular, an increase in layer thickness of the upper and lower cladding layers, which have a greater layer thickness than the waveguide layer, is the primary cause of a difference in layer thickness between the region remote from the mask 1 and in the opening 2. This creates nonuniformity in layer thickness on a substrate surface, which contributes to a decrease in yield in subsequent processes, e.g. nonuniformity in deposition in a resist deposition process.

SUMMARY OF THE INVENTION

It is an object of the present invention to solve the problem as stated above, and to provide a method for forming a film by selective area growth of MOCVD, controlling an increase in growth rate for every structural layer during collectively selective area growth of layers of a semiconductor optical waveguide structure or the like.

The foregoing and other objects of the present invention have been attained by providing a method for forming a film by selective area growth of MOCVD technique, which includes the steps of forming a mask on a semiconductor substrate having a (100) plane as a typical plane, the mask having a mask opening to selectively grow a compound semiconductor layer, and a slit which is narrower than the mask opening in width and controls a growth rate of the compound semiconductor layer at the mask opening; and selectively growing the compound semiconductor layer at a growth rate which is higher than that at a region quite away from the mask on the semiconductor substrate and which is lower than that in the case of a slitless mask, by reevaporating or diffusing growth species of the compound semiconductor layer on the mask to oversupply the growth species onto the mask opening and the slit.

It is preferable that the mask opening and the slit are arranged in parallel with a (011) crystal plane direction of the semiconductor substrate.

It is preferable that the method includes a step of utilizing a phenomenon that the growth species of the compound semiconductor layer forms a non-growth surface of a (111) B plane while maintaining a constant sharp angle at a portion in contact with a mask edge, and that the growth species self-stops growing when the growth species have had an isosceles triangle of cross-section, wherein after self-stop of growth, the compound semiconductor layer is selectively grown at the mask opening at a growth rate which is the same as the slitless mask.

It is preferable that the method includes a step of using a Group III organometallic source material and a Group V source material as materials for the compound semiconductor layer and changing a V/III ratio as a ratio of mol flow rates of the Group III organometallic source material and the Group V source material to modify a consumption amount of the growth species of the compound semiconductor layer at the slit, thereby to control the growth rate of the compound semiconductor layer at the mask opening.

It is preferable that the mask comprises a set of rectangular mask pieces having an opening at a central portion; the slits are arranged in parallel with the opening so as to pass through the mask pieces; and the growth rate of the compound semiconductor layer is controlled by the width of the slits.

It is preferable that the growth rate of the compound semiconductor layer is controlled by changing the number of the slits.

It is preferable that the growth rate of the compound semiconductor layer is controlled by changing location of the slit.

It is preferable that the growth rate of the compound semiconductor layer is controlled by changing the length of the slit in a longitudinal direction.

It is preferable that the growth rate of the compound semiconductor layer is controlled by changing the width of the mask in a longitudinal direction.

In accordance with the method for forming a film by selective area growth of MOCVD technique of the present invention, the mask has the slit formed therein to control the growth rate of the compound semiconductor layer at the opening, and the growth species for the compound semiconductor layer which have reevaporated or diffused on the mask are consumed at the slit. Because the growth species supplied to the opening decreases in comparison with a case of using a slitless mask, and the compound semiconductor layer is grown at the opening at a growth rate that is higher than that at a region quite away from the mask on the semiconductor substrate and is lower than that in the case of the slitless mask, the increase rate in growth rate at the mask opening can be restrained.

The growth species for a compound semiconductor layer are grown at the slit while forming a non-growth surface of a (111) B plane. The growth species self-stop growing when the growth species have had an isosceles triangle cross-section, and after that the growth species are not consumed at the slit. As a result, the compound semiconductor layer is grown at the opening at a growth rate similar to the case of using the slitless mask, and the growth rate at the mask opening can be restrained only during a specific growth period.

When the V/III ratio as a ratio of mol flow rates of a Group III organometallic source material and a Group V source material is higher than certain value, growth occurs on the (111) B plane as well, and the V/III ratio is lower than the certain value, growth dose not occur on the (111) B plane. From this standpoint, the V/III ratio can be changed to modify the consumption amount of the growth species for a compound semiconductor layer at the slit, thereby controlling the growth rate at the mask opening arbitrarily.

The slit can be arranged in parallel with he mask opening so as to pass through the mask, thereby controlling the growth rate at the mask opening throughout the entire region of the mask.

The width, the number and the location of the slit(s) can be changed to modify an effective mask width before and after growth has self-stopped at the slit. In this manner, the degree of restraint in growth rate at the mask opening can be controlled.

The length of the slit in a longitudinal direction can be changed to control the growth rate at a specific region of the mask opening in the longitudinal direction.

The width of the mask in the longitudinal direction can be changed to control the growth rate at a specific region of the mask opening in the longitudinal direction.

As explained, in accordance with the method for forming a film by selective area growth of MOCVD technique of the present invention, the mask can have the slit formed therein to decrease the supply amount of the growth species to the mask opening, thereby restraining the increase rate in growth rate at the opening. Because the same increase rate in growth rate as the case of using the conventional slitless mask can be obtained at the mask opening after having self-stopped growing at the slit, the increase rate in growth rate for every structural layer can be controlled during collectively selective area growth of a semiconductor optical waveguide structure and so on.

The width, the number and the location of the slit(s) can be changed to control the degree of restraint of increase rate in growth rate at the mask opening.

The length of the slit and the mask width in the longitudinal direction can be changed to modify the region where the increase rate in growth rate is controlled, thereby restraining the layer thickness of an arbitrary semiconductor layer.

DETAILED DESCRIPTION OF THE PREFERRED EMBODIMENTS

EMBODIMENT 1

Figure 1A:
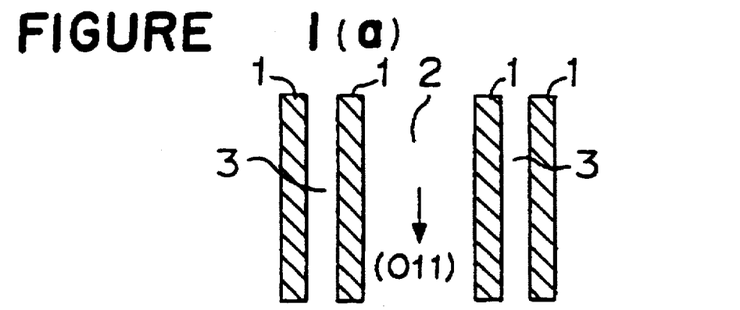
FIG. 1(a) is a top plan view of a mask used in a first embodiment according to the present invention.
Figure 1B:
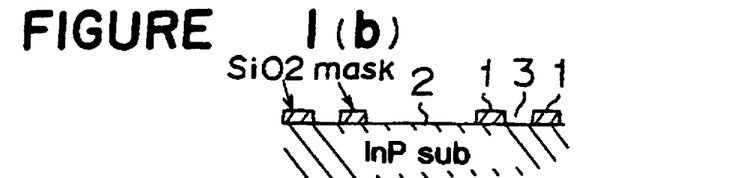
FIG. 1(b) is a cross-sectional view of the mask.

The basic embodiment of the film formation method in accordance with the present invention will be explained in reference to the accompanying drawings. Referring now to FIGS. 1(a) and 1(b), there are shown a top plan view of a mask used in this embodiment, and a cross-sectional view of the mask at its central portion. In those Figures, reference numeral 1 designates a mask element, reference numeral 2 designates a mask opening and reference numeral 3 designates a slit which passes between each of the rectangular mask elements 1 in a longitudinal direction. In this embodiment, the slits 3 are provided between the mask elements 1; The growth self-limiting function in (111) B plane growth at the slits, and a change in effective mask width in the growth time before and after the self-limiting are utilized to create a change in growth rate with regard to growth time.

Formation of the mask elements 1 will be explained. An $SiO_2$ film with a thickness of about 100 nm is formed on a pretreated (100) InP substrate, and a resist coating is applied to the film. A mask pattern shown in FIG. 1(a) is prepared using a photolithographic technique. After the InP substrate with the mask pattern formed thereon is pretreated with acid, the substrate is introduced into an MOCVD apparatus, for growing semiconductor layers.

Figure 1C:
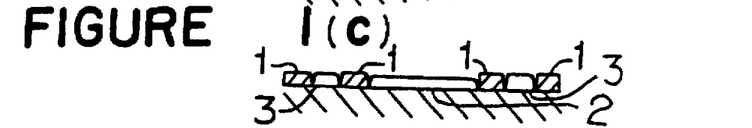
FIG. 1(c) is a cross-sectional view showing a growing state wherein a lower cladding layer is growing after commencement of growth in the first embodiment.

FIG. 1(c) is a cross-sectional view showing how a lower cladding layer grows after growth commencement. Since the mask opening 2 and the slits 3 are regions sandwiched by the mask elements 1 growth rate is increased due to oversupply of growth species by reevaporation and vapor phase diffusion in a direction transverse to the mask of growth species on the mask elements. Although the growth rate at the mask opening 2 increases in proportion to an adjacent mask width, the increase is lower than that in the conventional mask at this stage because the mask is narrower than the conventional mask because of the presence of the slits 3. Growing portions of each growth layer in contact with mask edges have oblique surfaces at about 54 degrees to the InP substrate surface because non-growth surfaces in (111) B planes are exposed.

Figure 1D:
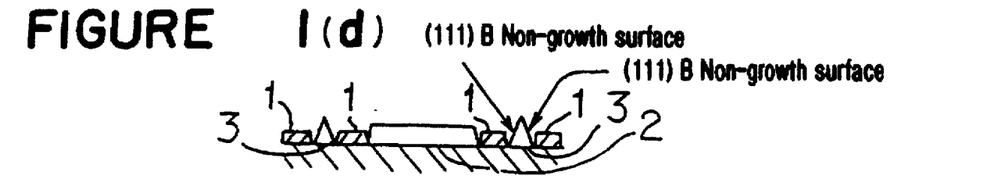
FIG. 1(d) is a cross-sectional view showing a growing state wherein the lower cladding layer growth has been completed in the first embodiment.

FIG. 1(d) is a cross-sectional view showing the growth which is obtained when the lower cladding layer growth has been completed. Although the mask opening 2 has growth continued at a low rate so that a trapezoidal sectional shape with non-growth surfaces in (111) B planes is exposed at the mask edges, the slits 3 have growth with an isosceles triangle cross-section having two sides at about 54 degrees to the InP substrate, which is obtained by further growth from the trapezoidal sectional shape. After this stage, the slits 3 do not have any additional growth, and growth stops because only the non-growth surfaces in (111) B planes are exposed.

Figure 1E:
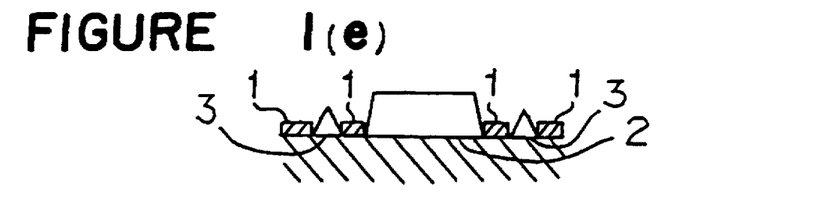
FIG. 1(e) is a cross-sectional view showing a growing state wherein an MQW waveguide layer and an upper cladding layer growth have been completed in the first embodiment.

FIG. 1(e) is a cross-sectional view showing completed growth of an MQW waveguide layer and an upper cladding layer. The slits 3 do not consume growth species because growth has stopped. This means that reevaporation of the growth species occurs at the slits 3 as on the mask elements 1. As a result, the effective mask width adjacent to the mask opening 2 is the same as the conventional slitless mask width at this stage.

Figure 1F:
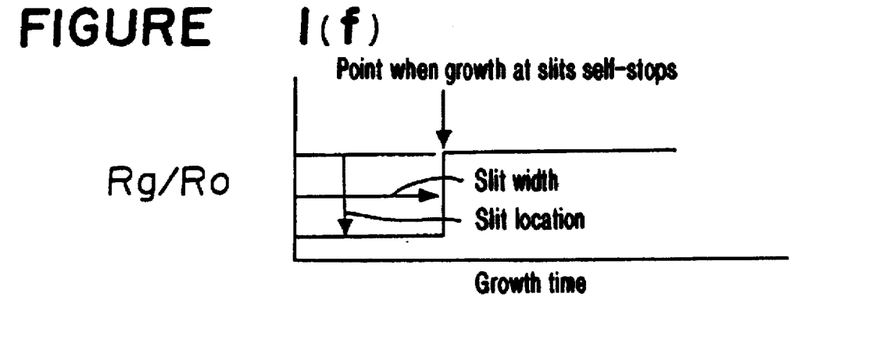
FIG. 1(f) is a graph showing a change in the increase in growth rate with regard to growth time at the mask opening in the first embodiment.

FIG. 1(f) is a graph showing a change in growth rate with regard to growth time at the mask opening 2 in this embodiment. Between growth commencement and the time when at the slits 3 the grown sectional shape becomes an isosceles triangle, the growth rate is restrained to a lower level than the case of growth using the conventional mask. During this period, growth of the lower cladding layer is carried out and is completed. Subsequently, growth of the MQW waveguide layer and the upper cladding layer is carried out at the growth rate as the conventional mask.

In this embodiment, if growth of the isosceles triangle cross-section has been completed at the slits 3 during growth of the lower cladding layer, a portion of the lower cladding layer would be grown at the conventional growth rate, causing the layer thickness of the lower cladding layer to be thicker than a designed layer thickness. If growth of the isosceles triangle cross-section has been completed at the slits during e.g., growth of the subsequent MQW waveguide layer, after completion of growth of the lower cladding layer, only a portion of the MQW waveguide layer would be grown at the conventional growth rate to have a thicker layer thickness. As a result, only a portion of the thickness of a quantum well structure layer or a quantum barrier layer which forms the MQW would increase and adversely affect device performance because it is not possible to realize an even layer thickness and a periodic structure of a composition which are required for the MQW to obtain a desired performance. This means that it is important in the present invention to accurately control the time when growth of the isosceles triangle of cross-section has been completed at the slits 3. The growth completion time is determined by a relationship between the designed layer thickness of the lower cladding layer, and the growth rate at the mask opening 2, and the slit width the slit width is especially significant.

As explained, in accordance with this embodiment, the mask 1 can have the slit 3 to restrain the growth rate for only the lower cladding layer during collective growth. As a result, the grown layer thickness of the lower cladding layer is thinner than that grown using the conventional mask. Normally, the semiconductor waveguide structure is designed to have a layer thickness so that the MQW waveguide layer is as thin as 100 nm, and the upper and lower cladding layers are as thick as 500–1,000 nm, which means that 90–95% of the total layer thickness is occupied by upper and the lower cladding layers. When the layer thickness of the lower cladding layer is about one-half, the layer thickness of the entire semiconductor layers is reduced by about 30%, nonuniformities on the substrate surface decreases.

When the slits are opened to pass through the entire length of the mask, such an effect can be realized throughout the entire mask length.

EMBODIMENT 2

Figure 2A:
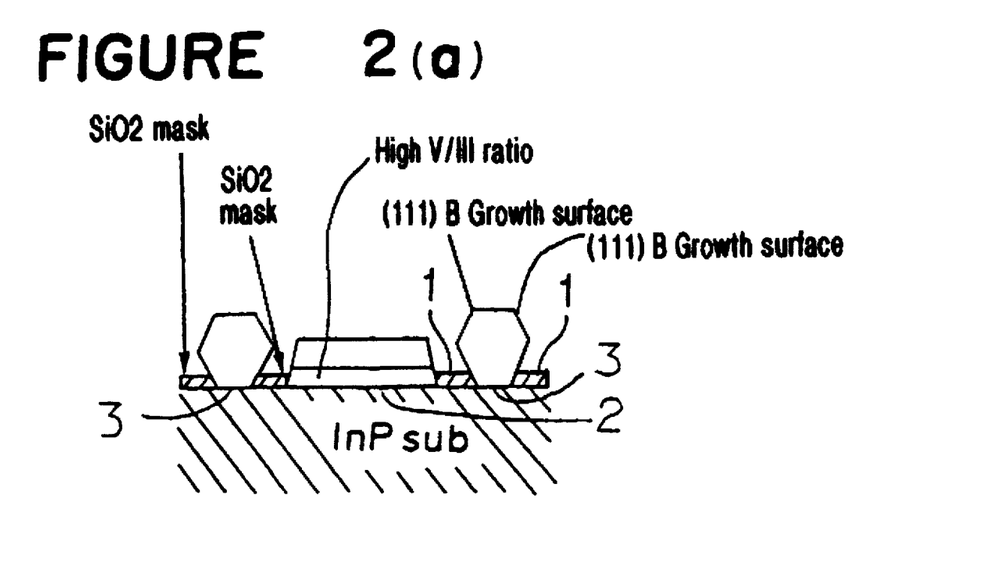
FIG. 2(a) is a cross-sectional view showing grown layers according to a second embodiment of the present invention.
Figure 2B:
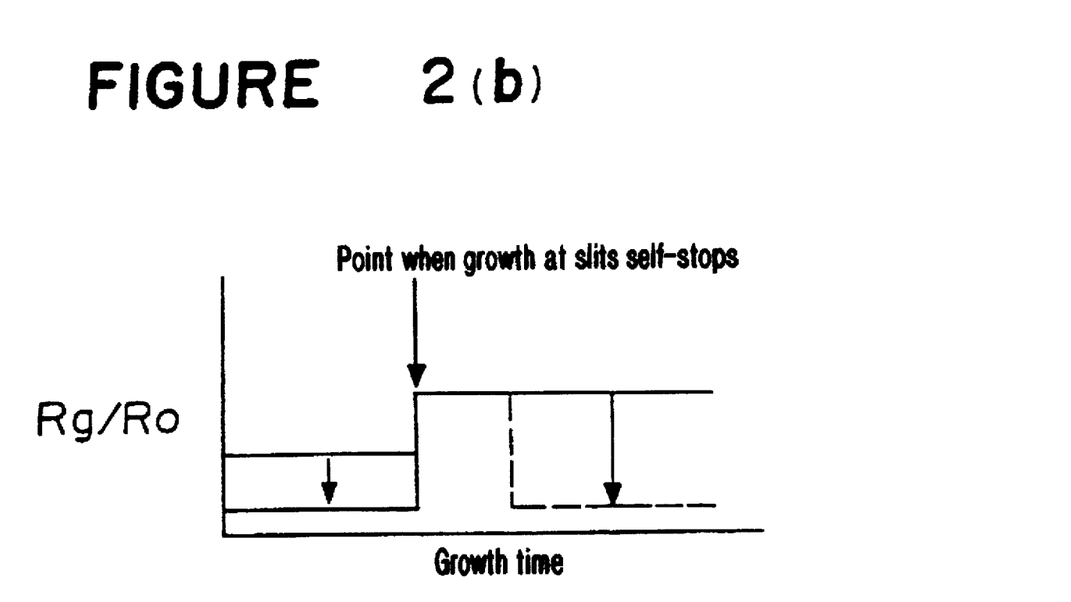
FIG. 2(b) is a graph showing a change growth rate with regard to growth time at the mask opening according to the second embodiment.

An effect which is obtained when the V/III ratio during growth is changed using the mask 1 described for the first embodiment will be explained with reference to a second embodiment. FIG. 2(a) is a cross-sectional view showing growth according to the second embodiment, and FIG. 2(b) is a graph showing a change in growth rate with regard to growth time at the mask opening 2. In the MOCVD growth, a Group III organometallic source material and a Group V source material are mixed and supplied in certain proportion, and the V/III ratio, i.e., the ratio of the flow rates ratio of the growth materials is a growth parameter. It is known that when growth is carried out at a raised V/III ratio, growth occurs on the (111) B planes as well. In accordance with the second embodiment, this principle is utilized to further restrain an increase in growth rate at the mask opening 2 in comparison to the first embodiment. The grown cross-section at the slits 3 becomes hexagonal as shown in FIG. 2(a) by carrying out growth under such a condition that the V/III ratio at the time of growing the upper and the lower cladding layer is higher than about 100 (the V/III ratio varies depending on device and growth parameters such as device structures and growth temperatures). This is because growth occurs on the oblique surfaces of the (111) B planes of the isosceles triangle of the first embodiment. The species reevaporated on the mask 1 is consumed there in a greater amount than in the first embodiment to decrease supply of the growth species to the mask opening 2. In this manner, the growth rate can be lowered as shown in FIG. 2(b) to further decrease the layer thickness of the upper and lower cladding layers. Conversely, the MQW waveguide layer can be grown at a low V/III ratio to prevent growth rate lowering at the mask opening 2.

Since growth on the (111) B planes can be changed by adjusting the V/III ratio to change the growth rate successively, the extent of the layer thickness decreasing effect can be changed at an arbitrary time during the same growth.

EMBODIMENT 3

Figure 3A:
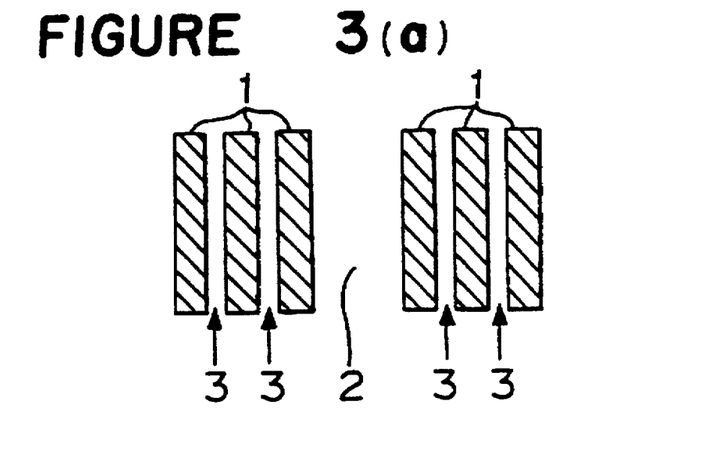
FIG. 3(a) is a top plan view showing a mask used in a third embodiment.

An effect which is obtained when the mask elements 1 have plural slits 3 therein, respectively, will be explained with reference to this embodiment. FIG. 3(a) is a top plan view of the mask according to this embodiment. Each mask element has two slits 2 that pass through the mask in a longitudinal direction. The mask width and the mask opening width are the same as those in the first embodiment.

Figure 3B:
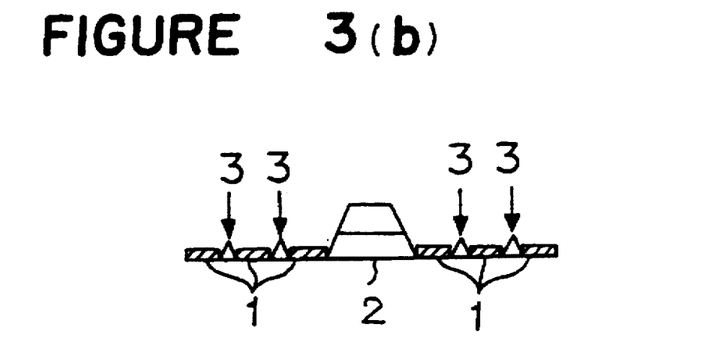
FIG. 3(b) is a cross-sectional view showing grown layers in the third embodiment.

FIG. 3(b) is a cross-sectional view showing the growth which is obtained when the two slits 3 are formed in the respective mask elements 1.

Figure 3C:
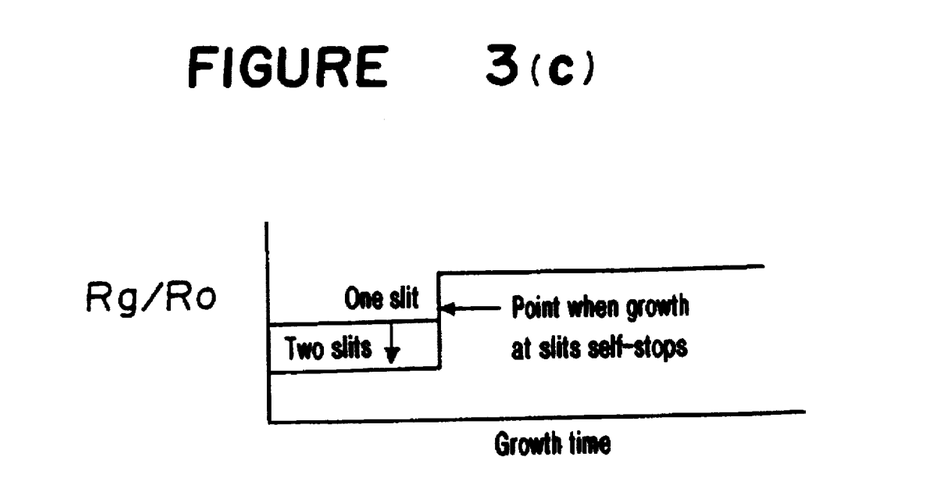
FIG. 3(c) is a graph showing a change growth rate with regard to growth time in the third embodiment.

Although the growing process at the slits 3 is the same as the first embodiment, the growth rate at the mask opening 2 is different depending on the number of the slits as shown in FIG. 3(c). Since an increase in the number of the slits 3 makes the mask width adjacent to the mask opening 2 narrower and decreases the excessive growth species supplied to the mask opening 2, the growth rate is lowered.

As explained, the growth rate at the mask opening 2 can be controlled depending on the number of the slits 3 in the mask 1.

EMBODIMENT 4

An effect which is obtained when location of the slits 3 in the mask 1 is changed will be explained with reference to this embodiment.

Figure 4A:
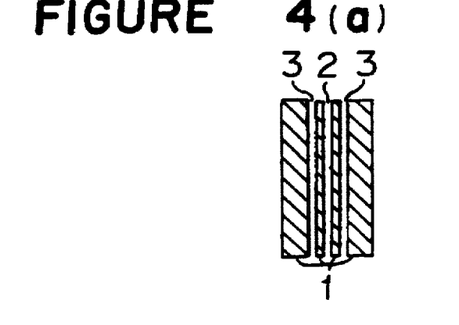
FIG. 4(a) is top plan view showing a mask wherein slits are formed in inner portions of mask elements in accordance with the fourth embodiment.
Figure 4B:
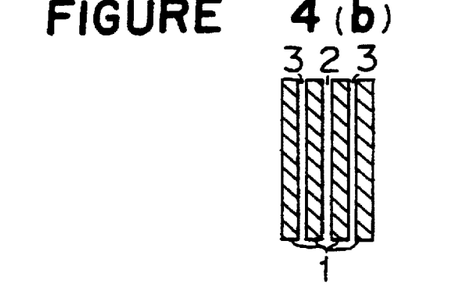
FIG. 4(b) is a top plan view showing a mask wherein slits are formed in central portions of mask pieces.
Figure 4C:
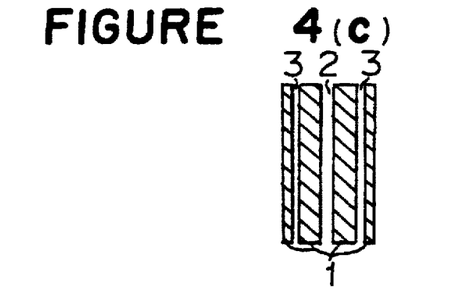
FIG. 4(c) is a top plan view showing a mask wherein slits are formed in outer portions of mask pieces.
Figure 4D:
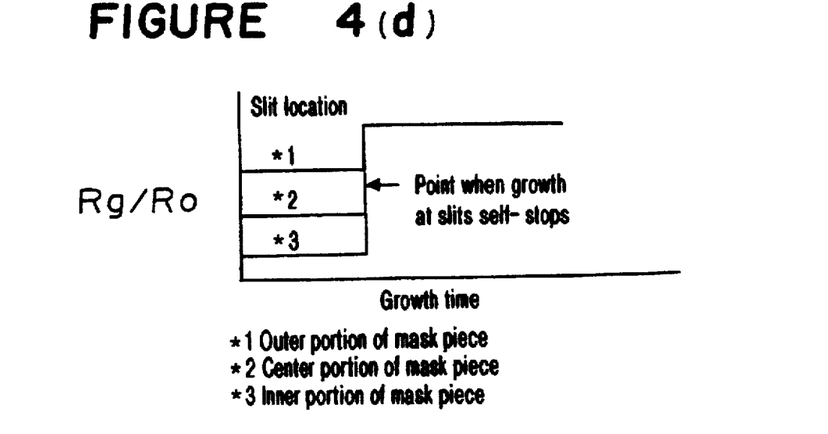
FIG. 4(d) is a graph showing a change in growth rate with regard to growth time at the mask opening in the fourth embodiment.

FIGS. 4(a), 4(b) and 4(c) are top plan views showing the mask 1 with the slits 3 in inner portions of the respective mask elements, the mask 1 with the slits 3 in central portions of the respective mask elements, and the mask 1 with the slits 3 formed in outer portions of the respective mask elements, respectively. A change in growth rate with regard to growth time in each case is shown in FIG. 4(d).

When the slits 3 are formed in the inner portions of the respective mask elements 1, the growth rate is lowers in comparison with the case of forming the slits 3 in the central portions of the respective mask elements because the mask width adjacent to the mask opening 2 is made narrower to decrease the excessive supply of growth species to the mask opening 2. Although this embodiment is based on the same principle as the third embodiment wherein the plural slits are formed, the extent of the decrease in growth rate is different. When the slits 3 are formed in the outer portions of the respective mask elements 1, the growth rate increases in comparison with the case of forming the slits 3 in the central portions of the respective mask elements 1 because the mask width adjacent to the mask opening 2 is made wider to increase the growth species supplied to the mask opening 2. In those cases, the increase in growth rate after self-limiting of growth at the slits 3 is the maximum increase rate which is determined by the entire mask width.

As explained, the increase rate in growth rate at the mask opening 2 can be controlled depending on location the slits 3 in the mask 1.

EMBODIMENT 5

An effect which is obtained when plural slits 3 having different slit widths are formed in the respective mask elements 1 will be explained with reference to this embodiment.

Figure 5A:
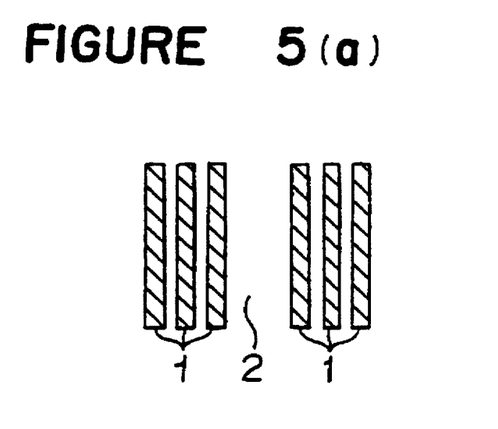
FIG. 5(a) is a top plan view showing a mask used in a fifth embodiment of the present invention, wherein mask elements have two slits having the same width, respectively.
Figure 5B:
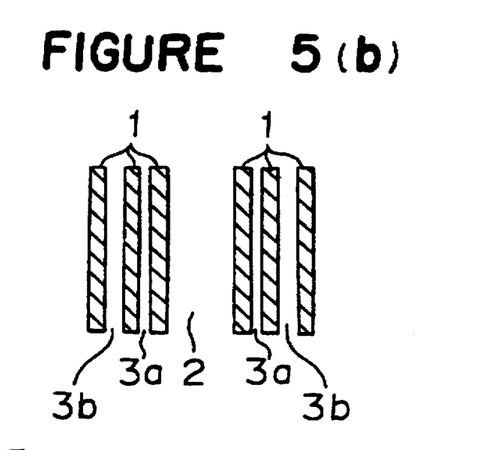
FIG. 5(b) is a top plan view of a mask used in the fifth embodiment, wherein mask elements have two slits having different widths, respectively.
Figure 5C:
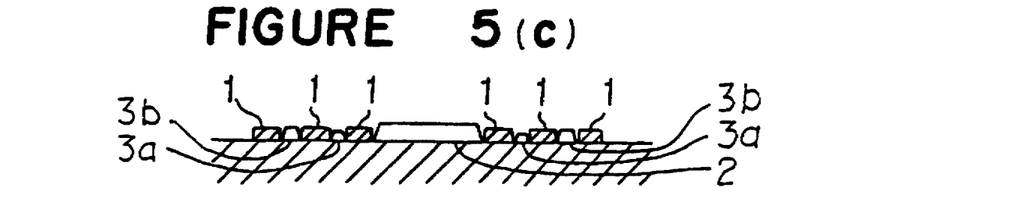
FIG. 5(c) is a cross-sectional view showing a growing state wherein growth is occurring at the slits after growth commencement in accordance with the fifth embodiment.
Figure 5D:
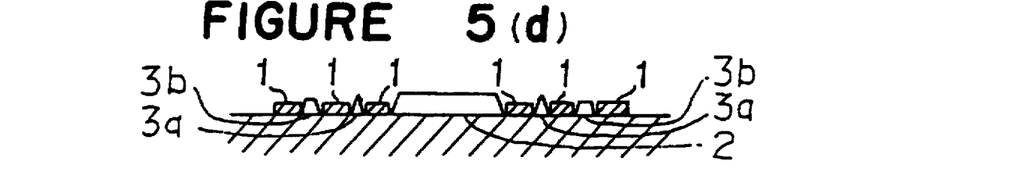
FIG. 5(d) is a cross-sectional view showing a growing state which is obtained when growth stops at narrower slits in accordance with fifth embodiment.
Figure 5E:
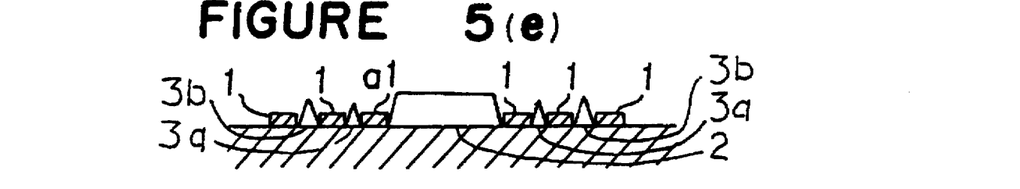
FIG. 5(e) is a cross-sectional view showing a growing state which is obtained when growth has stopped at the respective slits in accordance with the fifth embodiment.
Figure 5F:
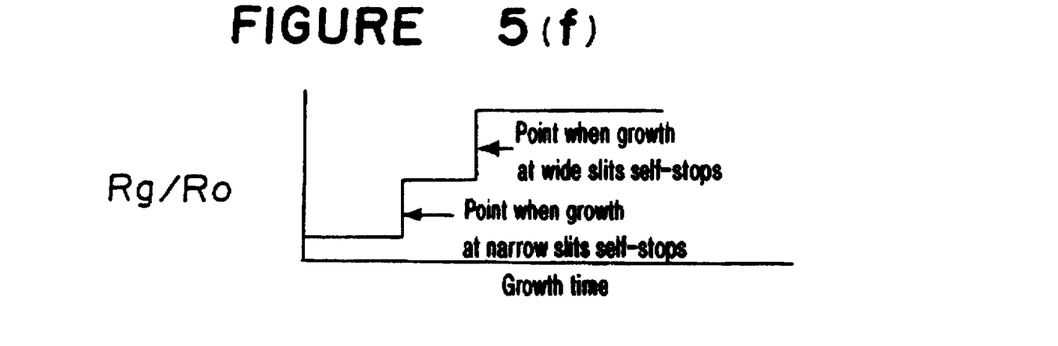
FIG. 5(f) is a graph showing a change in growth rate with regard to growth time in the fifth embodiment.

FIG. 5(a) is a top plan view showing a mask with two slits 3 having the same width in each mask element 1 like the third embodiment. On the other hand, FIG. 5(b) is a top plan view of a mask with two slits 3(a) and 3(b) having different widths in each mask element. FIGS. 5c(c), 5(d) and 5(e) are cross-sectional views showing the growth which is obtained when the mask 1 having each mask element including two slits different in width as shown in FIG. 5(b) is used. FIG. 5(f) is a graph showing a change in growth rate with regard to growth time which is obtained when the mask 1 having each mask element with the two slits different in width is used.

When the mask has in each mask element the two slits 3 having the same width, the growth rate can be lower for a certain period of time because of the time which is required for growth to self-stop at the slits 3 is the same for the two slits in each mask element. On the other hand, when the two slits are different in width in each mask element, the growth rate with regard to growth time changes in a two-stage manner as shown in FIG. 5(F) because the time when growth self-stops at the slits 3 is different For each slit.

When the mask 1 with two different slit widths is used, the slits 3a and 3b consume the growth species after growth commencement, and the mask width which contributes to the increase rate in growth rate at the mask opening 2 is the narrowest (FIG. 5c). Subsequently, growth self-stops at the slits 3a having a narrower width (FIG. 5d). Although growth is continuing at the slits 3b having the wider width at this stage to and consumes the growth species at the slits 3b, growth has self-stopped at the slits 3a having the narrower width. As a result, the mask width which contributes to the increase in growth rate at the mask opening 2 extends to the edges of the wider slits 3b, increasing the growth rate at the mask opening 2 to a higher level. When growth has self-stopped at the wider slits 3b (FIG. 5(e)), there is no consumption of the growth species at any slits because growth has self-stopped at all the slits. As a result, the mask width which contributes to a increase in growth rate at the mask opening 2 becomes the entire mask width, and the growth rate at the mask opening 2 increases further.

As explained, when plural slits which are different in width are formed, a change in growth rate with regard to growth time can be separated at a multi-stage manner.

EMBODIMENT 6

Figure 6A:
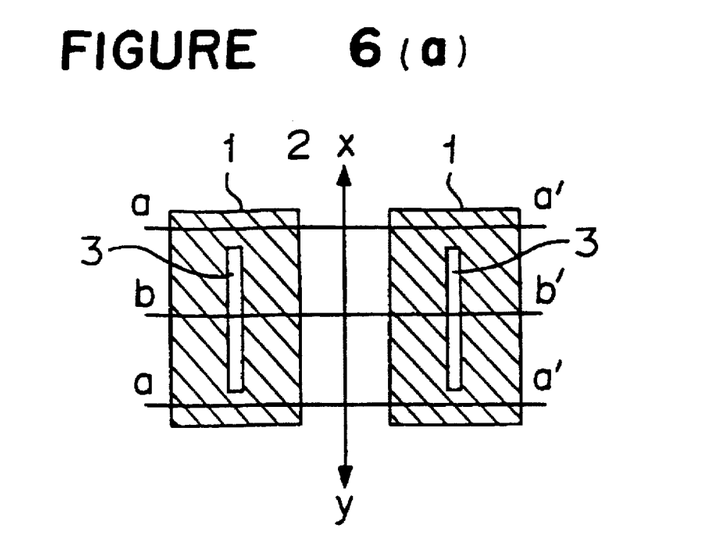
FIG. 6(a) is a top plan view of a mask used in a sixth embodiment.
Figure 6B:
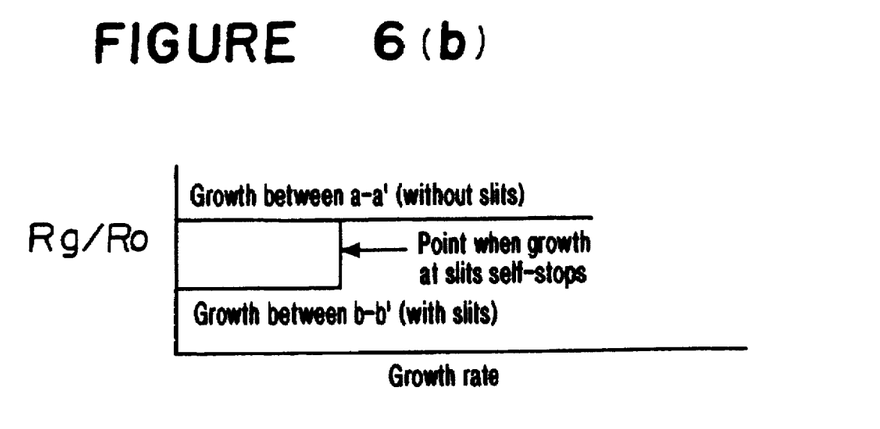
FIG. 6(b) is a graph showing a change in growth time with regard to an increase in growth rate along the section line a–a' and along the section line b–b' in FIG. 6(a)

A two-dimensional restraint on an increase rate in growth rate which is obtained by changing the length of the slits 3 will be explained with reference to this embodiment. FIG. 6(a) is a top plan view of a mask wherein the length of the slits 3 is limited to a portion of the mask elements in a longitudinal direction of the mask 1. The slits 3 do not pass through the mask 1 in the longitudinal direction. A change in growth rate with regard to growth time along the a-a' section line, and the b-b' section line of FIG. 6(a) in the case of using the mask 1 shown in FIG. 6(a) is shown in FIG. 6(b). At the a-a' section line, growth which is the same as the conventional growth is carried out, the increase in growth rate at the mask opening 2 is the maximum value which is determined by the mask width, and growth progresses at a certain increase rate irrespective of lapse of the growth time. On the other hand, along the b-b' section line, the increase in growth rate is restrained up to a certain growth time by the effect which was described in reference to the first embodiment.

Figure 6C:
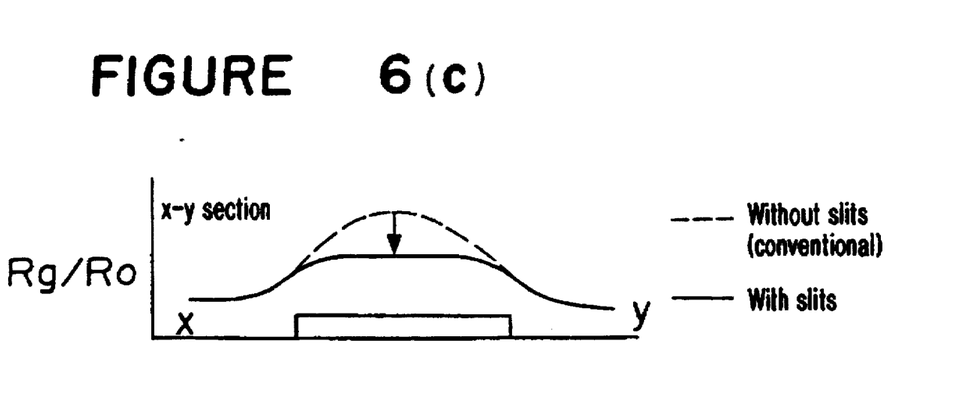
FIG. 6(c) is a graph showing a change growth rate with regard to location along the section line x-y at the center of the mask opening in FIG. 6(a)

In FIG. 6(c), such an effect is shown as a change in growth rate with regard to location at the x-y section in a central portion of the mask opening 2 in FIG. 6(a). In the time period from growth commencement to self-limiting of growth at the slits 3, only the increase in growth rate at a region in the vicinity of the slits 3 formed in the longitudinal direction of the mask is restrained and flattened. After that, in the time period from self-limiting of growth at the slit 3 to growth completion, growth is made with the conventional growth rate.

As explained, when the length of slits 3 is limited to a portion of the mask 1 in the longitudinal direction, the increase in growth rate at the mask opening 2 can be partially restrained only for a certain period of the growth time.

When the length of the slits 3 is separated into plural parts in a portion of the longitudinal direction of the mask 1, the increase in growth rate along the x-y section line in the central portion of the mask opening 2 can be separated into plural sections. This means that a plurality of functional elements can be collectively fabricated in the longitudinal direction of the mask 1.

EMBODIMENT 7

Figure 7A:
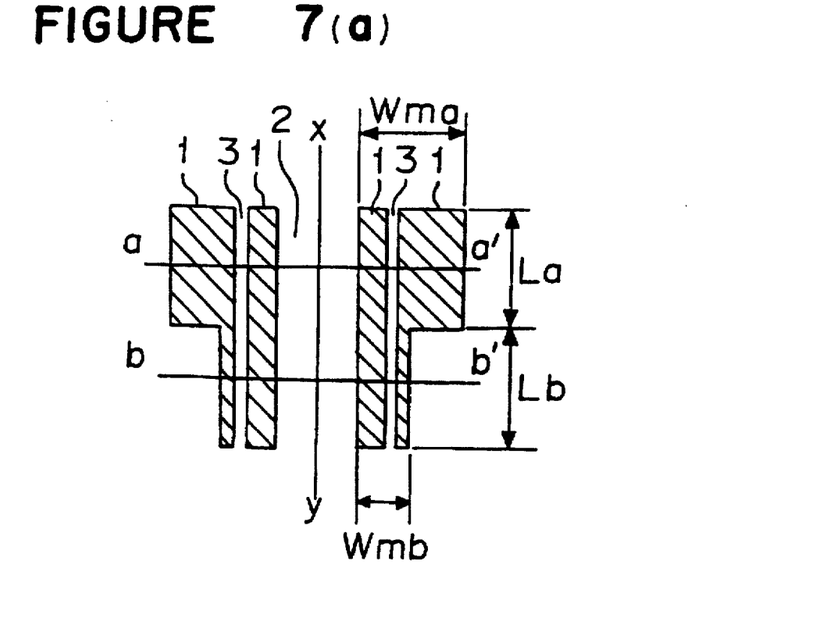
FIG. 7(a) is a top plan view of a mask used in a seventh embodiment.
Figure 7B:
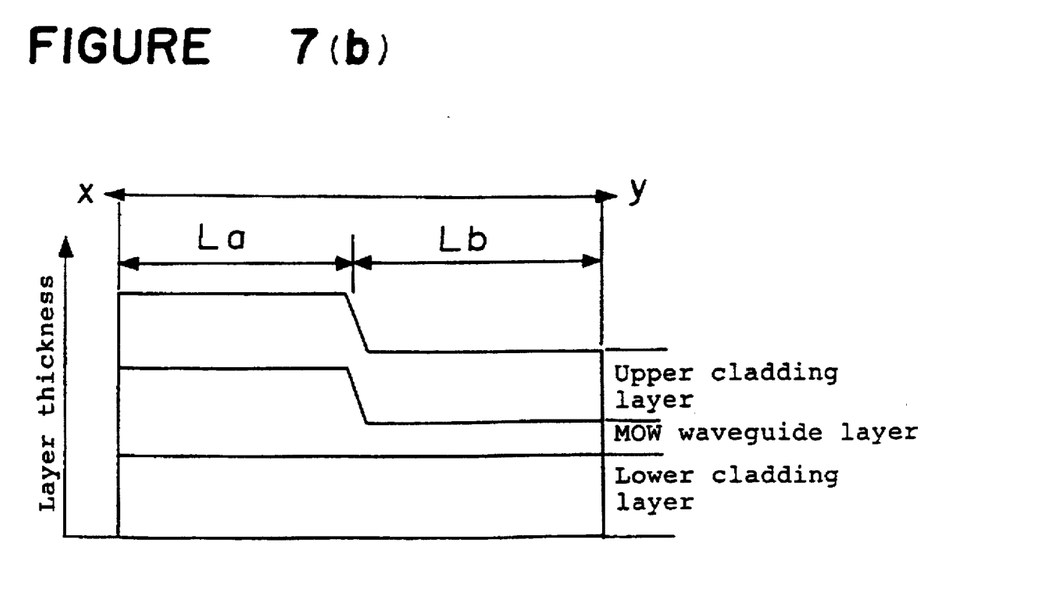
FIG. 7(b) is a graph showing the grown layer thickness along the line x-y in FIG. 7(a)

In FIG. 7(a), there is shown a seventh embodiment of the present invention. An effect which is obtained when the mask width changes in the longitudinal direction of the mask 1 will be explained with respect to this embodiment. FIG. 7(a) is a top plan view showing a mask 1 wherein two different mask widths, Wma and Wmb, are successively formed to have mask lengths La and Lb in the longitudinal direction of the mask, respectively. The mask opening width and the slit width are the same as those of the first embodiment.

When the mask 1 shown in FIG. 7(a) is used, the growth rate at the mask opening 2 at the a-a' section line, and that along the b-b' section are the same throughout the entire length of the mask up to the self-limiting of growth because the mask width adjacent to the mask opening 2 is common to both sections.

After self-limiting of growth at the slits 3, the a-a' section line has a greatly increased in growth rate because the mask width along the a-a' section line is Wma' effectively. On the other hand, along the b-b' section line there is a slightly increased growth rate because the mask width is Wmb' effectively. As a result, when the mask 1 shown in FIG. 7(a) is used, the growth which is obtained along the x-y section line in the central portion of the mask opening 2 is such that only the lower cladding layer has the same grown layer thickness at both mask lengths La and Lb, and the grown layer thickness of the MQW waveguide layer and the upper cladding layer has the region La in the mask length that is relatively thick and the region Lb in the mask length that is relatively thin.

As explained, when the mask width changes in the longitudinal direction of the mask, and the slits 3 are formed, the increase in growth rate can be changed in the longitudinal direction of the mask to restrain the layer thickness of an arbitrary semiconductor layer.

Obviously, numerous modifications and variations of the present invention are possible in light of the above teachings. It is therefore to be understood that within the scope of the appended claims, the invention may be practiced otherwise than as specifically described herein.

What is claimed is:

1. A method for forming a film by selective metal organic chemical vapor deposition (MOCVD) comprising:

forming a mask on a surface of a semiconductor substrate having a (100) plane orientation, the mask having a mask opening for selectively growing a compound semiconductor layer and a slit narrower than the mask opening for controlling growth rate of the compound semiconductor layer in the mask opening; and growing the compound semiconductor layer by MOCVD on the semiconductor substrate in the mask opening and in the slit whereby the compound semiconductor layer grows at a slower rate in the mask opening than when no slit is present in the mask.

2. The method according to claim 1, wherein the mask opening and the slit are parallel to a (011) crystal plane direction of the semiconductor substrate.

3. The method according to claim 2, which including growing the compound semiconductor layer in the slit to form grown surfaces in (111)B planes that stop growing when the compound semiconductor layer has an isosceles triangle cross-section so that the compound semiconductor layer is selectively grown in the mask opening at a growth rate that is the same as when a slitless mask is used.

4. The method according to claim 2 including using a Group III organometallic source material and a Group V source material for growing the compound semiconductor layer and changing a ratio of mol flow rates of the Group III organometallic source material and the Group V source material to consumption amount of the growth species of the compound semiconductor layer at the slit, thereby to control the growth rate of the compound semiconductor layer in the mask opening.

5. The method according to claim 2, wherein the mask comprises a set of rectangular mask elements having an opening at a central portion, the slits are parallel to the opening, and including controlling the growth rate of the compound semiconductor layer by controlling the width of the slits.

6. The method according to claim 2, wherein the mask comprises a set of rectangular mask elements having an opening at a central portion, the slits are parallel to the opening, and including controlling the growth rate of the compound semiconductor layer by changing the number of the slits.

7. The method according to claim 2, wherein the mask comprises a set of rectangular mask elements having an opening at a central portion, the slits are parallel to the opening, and including controlling the growth rate of the compound semiconductor layer by changing the locations of the slits.

8. The method according to claim 2, wherein the mask comprises a set of rectangular mask elements having an opening at a central portion, the slits are parallel to the opening, and including controlling the growth rate of the compound semiconductor layer by changing the length of the slits in a longitudinal direction.

9. The method according to claim 2, wherein the mask comprises a set of rectangular mask elements having an opening at a central portion, the slits are parallel to the opening, and including controlling the growth rate of the compound semiconductor layer by changing the width of the mask in a longitudinal direction.

10. The method according to claim 1 including growing the compound semiconductor layer in the slit to form grown surfaces in (111)B planes that stop growing when the compound semiconductor layer has an isosceles triangle cross-section so that the compound semiconductor layer is selectively grown in the mask opening at a growth rate that is the same as when a slitless mask is used.

11. The method according to claim 10, wherein the mask comprises a set of rectangular mask elements having an opening at a central portion, the slits are parallel to the opening, and including controlling the growth rate of the compound semiconductor layer by controlling the width of the slits.

12. The method according to claim 10, wherein the mask comprises a set of rectangular mask elements having an opening at a central portion, the slits are parellel to the opening, and including controlling the growth rate of the compound semiconductor layer by changing the number of the slits.

13. The method according to claim 10, wherein the mask comprises a set of rectangular mask elements having an opening at a central portion, the slits are parallel to the opening, and including controlling the growth rate of the compound semiconductor layer by changing the locations of the slits.

14. The method according to claim 10, wherein the mask comprises a set of rectangular mask elements having an opening at a central portion, the slits are parallel to the opening, and including controlling the growth rate of the compound semiconductor layer by changing the length of the slits in a longitudinal direction.

15. The method according to claim 10, wherein the mask comprises a set of rectangular mask elements having an opening at a central portion, the slits are parallel to the opening, and including controlling the growth rate of the compound semiconductor layer by changing the width of the mask in a longitudinal direction.

16. The method according to claim 1, including using a Group III organometallic source material and a Group V source material for growing the compound semiconductor layer and changing a ratio of mol flow rates of the Group III organometallic source material and the Group V source material to modify a consumption amount of the growth species of the compound semiconductor layer in the slit, thereby to control the growth rate of the compound semiconductor layer at the mask opening.

17. The method according to claim 16, wherein the mask comprises a set of rectangular mask elements having an opening at a central portion, the slits are parellel to the opening, and including controlling the growth rate of the compound semiconductor layer by controlling the width of the slits.

18. The method according to claim 16, wherein the mask comprises a set of rectangular mask elements having an opening at a central portion, the slits are parallel to the opening, and including controlling the growth rate of the compound semiconductor layer by changing the number of the slits.

19. The method according to claim 16, wherein the mask comprises a set of rectangular mask elements having an opening at a central portion, the slits are parallel to the opening, and including controlling the growth rate of the compound semiconductor layer by changing the locations of the slits.

20. The method according to claim 16, wherein the mask comprises a set of rectangular mask elements having an opening at a central portion, the slits are parallel to the opening, and including controlling the growth rate of the compound semiconductor layer by changing the length of the slits in a longitudinal direction.

21. The method according to claim 16, wherein the mask comprises a set of rectangular mask elements having an opening at a central portion, the slits are parallel to the opening, and including controlling the growth rate of the compound semiconductor layer by changing the width of the mask in a longitudinal direction.

22. The method according to claim 1, wherein the mask comprises a set of rectangular mask elements having an opening at a central portion, the slits are parallel to the opening, and including controlling the growth rate of the compound semiconductor layer by controlling the width of the slits.

23. The method according to claim 1, wherein the mask comprises a set of rectangular mask elements having an opening at a central portion, the slits are parallel to the opening, and including controlling the growth rate of the compound semiconductor layer by changing the number of the slits.

24. The method according to claim 1, wherein the mask comprises a set of rectangular mask elements having an opening at a central portion, the slits are parallel to the opening, and including controlling the growth rate of the compound semiconductor layer by changing the locations of the slits.

25. The method according to claim 1, wherein the mask comprises a set of rectangular mask elements having an opening at a central portion, the slits are parallel to the opening, and including controlling the growth rate of the compound semiconductor layer by changing the length of the slits in a longitudinal direction.

26. The method according to claim 1, wherein the mask comprises a set of rectangular mask elements having an opening at a central portion, the slits are parallel to the opening, and including controlling the growth rate of the compound semiconductor layer by changing the width of the mask in a longitudinal direction.

27. The method according to claim 1 including growing the compound semiconductor layer by MOCVD on the semiconductor substrate in the mask opening and in the slit to form grown surfaces of the compound semiconductor layer on which MOCVD growth does not occur, until growth of the compound semiconductor layer in the slit stops, whereupon the growth rate of the compound semiconductor layer in the mask opening increases.

* * * * *